United States Patent [19]

Kim

[11] Patent Number: 5,159,603
[45] Date of Patent: Oct. 27, 1992

[54] QUANTUM WELL, BEAM DEFLECTING SURFACE EMITTING LASERS

[75] Inventor: Jae H. Kim, Bellevue, Wash.

[73] Assignee: United States of America as represented by the Administrator, National Aeronautics and Space Administration, Washington, D.C.

[21] Appl. No.: 710,424

[22] Filed: Jun. 5, 1991

[51] Int. Cl.$^5$ .............................................. H01S 3/19
[52] U.S. Cl. ........................................ 372/45; 372/46
[58] Field of Search ............................ 372/45, 46, 50

[56] References Cited

U.S. PATENT DOCUMENTS

| | | | |
|---|---|---|---|
| 3,824,493 | 7/1974 | Hakki | 311/94.5 |
| 4,468,850 | 9/1984 | Liau et al. | 29/569 L |
| 4,523,317 | 6/1985 | Botez | 372/45 |
| 4,523,318 | 6/1985 | Connolly et al. | 372/48 |
| 4,636,821 | 1/1987 | Yanase et al. | 357/17 |
| 4,660,207 | 4/1987 | Svilans | 372/45 |
| 4,675,876 | 6/1987 | Svilans | 372/96 |

(List continued on next page.)

OTHER PUBLICATIONS

Yang et al., "Surface-Emitting GaAlAs/GaAs Laser with Etched Mirrors", *Elec. Lett.*, vol. 22, No. 8, 10th Apr. 1986, pp. 438–439.

Yang, et al., "Surface-Emitting GaAlAs/GaAs linear laser arrays with etched mirrors", *Appl. Phys. Lett.*, 49(18), 3 Nov. 1986, pp. 1138–1139.

Shieh et al., "Low threshold Current Surface Emitting AlGaAs/GaAs Laser with 45° Metallised Reflector", Elec. Lett., vol. 24, No. 6, 17th Mar. 1988, pp. 343–344.

Kim et al., "High-Power AlGaAs/GaAs Single Quantum Well 45°-Beam-Deflecting Surface-Emitting Lasers", *IEEE Leos Conference*, Abstract submitted Jun. 8, 1990, 2 pages.

Kim et al., "45° Beam Deflecting Single Quantum Well Surface-Emitting Lasers for Optoelectronic Neural Networks", *IEEE Nov.* 4–9, 1990 Leos Conference Proceedings, 2 pages.

Kim et al., "High-Power AlGaAs/GaAs single quantum well surface-emitting lasers with integrated 45° beam deflectors", *Appl. Phys. Lett.* 57(20), 12 Nov. 1990, pp. 2048–2050.

Kim et al., "Pseudomorphic In Ga$_{1-y}$As/GaAs/Al$_x$Ga$_{1-x}$As single quantum well surface-emitting lasers with integrated 45° beam deflectors", *Appl. Phys. Lett.* 58(1), 7 Jan. 1991, pp. 7–9.

*Primary Examiner*—Georgia Y. Epps
*Attorney, Agent, or Firm*—John H. Kusmiss; Thomas H. Jones; Guy M. Miller

[57] ABSTRACT

A surface emitting laser or SEL having a pair of vertical oscillator mirrors and a pair of integrated 45° beam deflectors etched in a pair of parallel grooves in a broad-area multilayered wafer by tilted ion beam etching. Each SEL has high output power, low threshold current density, relatively high efficiency, and is compatible with large scale optoelectronic integrated circuit technology. One embodiment includes a lattice matched, unstrained AlGaAs/GaAs single quantum well (SQW) optical cavity in a graded index separate confinement heterostructure (GRINSCH). A second embodiment is a 945 nm lattice-mismatched or pseudomorphic In$_{0.15}$Ga$_{0.85}$As/AlGaAs SQW optical cavity SEL in a GRINSCH configuration in which the lattice mismatch is accommodated by elastic deformation of the lattice. Strain-induced reduction of valence band non-parabolicity and effective density states permits operation with a relatively low threshold current and improved spectral and dynamic properties. The GaAs substrate is transparent to the emitted radiation providing increased flexibility in circuit design because radiation may be coupled both up through the grooves and/or down through the substrate. Emitting radiation in both directions permits three dimensional optoelectronic circuits to be fabricated both above and below this embodiment and enhances coupling to other optical devices, including fiber optic rods.

15 Claims, 1 Drawing Sheet

U.S. PATENT DOCUMENTS

| | | | |
|---|---|---|---|
| 4,675,877 | 6/1987 | Svilans | 372/96 |
| 4,677,629 | 6/1987 | Lesh | 372/18 |
| 4,718,070 | 1/1988 | Liau et al. | 372/50 |
| 4,755,015 | 7/1988 | Uno et al. | 350/96.12 |
| 4,760,578 | 7/1988 | Oshima et al. | 372/45 |
| 4,777,148 | 10/1988 | Liau et al. | 437/129 |
| 4,784,722 | 11/1988 | Liau et al. | 156/649 |
| 4,796,269 | 1/1989 | De Freez et al. | 372/50 |
| 4,797,892 | 1/1989 | De Freeze et al. | 372/50 |
| 4,807,238 | 2/1989 | Yokomori | 372/32 |
| 4,811,348 | 3/1989 | Arimoto et al. | 372/29 |
| 4,873,696 | 10/1989 | Coldren et al. | 372/96 |
| 4,881,236 | 11/1989 | Brueck et al. | 372/45 |
| 4,881,237 | 11/1989 | Donnelly | 372/50 |
| 4,894,833 | 11/1990 | Carlin | 372/44 |
| 4,894,840 | 11/1990 | Liau et al. | 372/108 |
| 4,901,327 | 2/1990 | Bradley | 372/45 |
| 4,906,839 | 3/1990 | Lee | 250/239 |
| 4,935,939 | 6/1990 | Liau et al. | 372/98 |
| 4,942,366 | 7/1990 | Toda | 330/4.3 |
| 4,943,782 | 7/1990 | Stephens et al. | 330/4.3 |
| 4,943,970 | 7/1990 | Bradley | 372/45 |
| 4,949,350 | 8/1990 | Jewell et al. | 372/45 |
| 4,949,351 | 8/1990 | Imanaka | 372/45 |
| 4,950,622 | 8/1990 | Kwon et al. | 437/129 |
| 4,952,019 | 8/1990 | Evans et al. | 350/96.19 |
| 4,956,844 | 9/1990 | Goodhue et al. | 372/44 |

QUANTUM WELL, BEAM DEFLECTING SURFACE EMITTING LASERS

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

This invention relates generally to semiconductor quantum well surface emitting lasers, or SEL's, and in particular to beam deflecting SEL's suitable for monolithic integration with other optoelectronic devices for use, for example, in optoelectronic neural networks.

BACKGROUND OF THE INVENTION

Recent advances in surface-emitting lasers, or SEL's, have stimulated interest in their potential applications, including monolithic two-dimensional arrays, optical interconnects in very large scale integrated circuits, optical parallel processing and optical neural networks. The implementation of an optical neural network requires two basic components; large arrays of neurons and interconnections therebetween. A neuron may be an optical nonlinear processing element, such as a thresholding device, that can be implemented for example by monolithically integrating a combination of a switching amplifier, a photodetector and a light source such as an SEL on a single chip.

SEL's emit light in a direction normal to the plane of their substrates. Conventional SEL's have been designed in various configurations including horizontal cavity lasers with either internal or external 45° beam deflectors, horizontal cavity lasers with second-order grating couplers and vertical cavity lasers with quarter-wavelength Bragg reflector stacks. Second-order grating lasers and vertical cavity lasers are difficult to monolithically integrate with other optoelectronic devices because of the complexity of fabrication and epitaxial structural incompatibilities.

SEL's with 45° beam deflectors are attractive for use in optoelectronic devices because of the relatively easy integrability and the structural and processing compatibility with other optoelectronic devices. In addition, because of their technological similarity, horizontal cavity SEL's with 45° beam deflectors can take full advantage of the well-developed edge-emitting Fabry-Perot laser technology, but conventional designs typically suffer from relatively high threshold current density and relatively low efficiency when compared with other conventional types of SEL's.

Conventional SEL's with a single 45° beam deflector may be fabricated from a wafer consisting of a GaAs substrate on which double heterostructural layers of AlGaAs and GaAs have been grown epitaxially to form a p-n junction and an optical waveguide. When current is directed across the p-n junction, electrons and holes are injected into and confined within the active layer by the double heterojunction. Light is emitted when the confined electrons and holes recombine in the active layer. The waveguide serves to confine this light to a thin active layer in the plane of the wafer.

Laser cavities, for example, 0.1 $\mu$m $\times$ 4 $\mu$m $\times$ 300 $\mu$m, are formed by restricting light laterally, such as by a lateral waveguide in the case of index-guided lasers, or by confining current laterally, as in the case of gain-guided lasers. Vertical laser oscillator mirrors define the longitudinal dimensions of the SEL and are conventionally formed by cleaving and/or etching the wafer crystal perpendicular to the waveguide.

By forming a beam deflector across the light path, 45° to the plane of the wafer, light which would otherwise remain within the waveguide may be reflected away from the SEL in a direction generally normal to the plane of the wafer. The cleaved mirrors themselves, without 45° beam deflectors, allow lasers to emit light only through the edge parallel to the substrate. This limits use of such devices in monolithic integration. Edge emitting lasers of this type are not attractive for use in the implementation of optical neural networks. 45° beam deflectors have been fabricated by several techniques, including chemical etching, ion-milling, ion-beam etching and focused ion beam micromachining.

A horizontal cavity SEL with a 45° beam deflector has been described by Yang et al., in Electron. Lett. 24, 343 (1988). An AlGaAs/GaAs double heterojunction laser is used together with a metalized 45° mirror. One of the two vertical oscillator mirrors is formed by cleaving, while the other is formed by dry etching. The cleaved mirror limits the monolithic integration of this type of SEL with other optoelectronic devices.

While conventional SEL's have met with some success, there remains a need for a more efficient, higher output power and low threshold current density SEL having less power dissipation. The needed SEL's should be compatible with other optoelectronic devices and conventional monolithic IC fabrication techniques for integration in large scale optoelectronic integrated circuits.

BRIEF STATEMENT OF THE INVENTION

The preceding and other shortcomings of the prior art are addressed and overcome by the present invention which provides an SEL having a pair of vertical oscillator mirrors and integrated 45° beam deflectors formed in grooves by tilted ion beam etching from a broad-area multilayered wafer.

In a first aspect, the present invention provides a surface emitting semiconductor laser with a GRINSCH SQW laser structure including a substrate having active layer with a horizontal laser cavity therein and a pair of parallel etched grooves in the substrate, each such groove including a substantially vertical oscillating mirror and a substantially 45° beam deflector for the laser cavity.

In a further aspect, the laser structure is pseudomorphic where the lattice mismatch is accommodated by elastic deformation of the lattice, reducing threshold current and causing the laser to emit light transparent to its substrate so that light may be coupled upward through the grooves and/or downward through the substrate for greater circuit design flexibility.

In another aspect, the present invention provides a method of fabricating surface emitting semiconductor lasers, in either wide stripe, e.g. 50-100 $\mu$m, geometry or narrow stripe, e.g. 3-5 $\mu$m, ridge waveguide geometry, by forming a GRINSCH SQW laser structure having an active layer with a horizontal laser cavity in a substrate and etching a pair of parallel grooves in the substrate, each such groove including a substantially vertical oscillating mirror and a substantially 45° beam deflector for the laser cavity.

These and other features and advantages of this invention will become further apparent from the detailed description that follows which is accompanied by one or more drawing figures. In the figures and description, numerals indicate the various features of the invention, like numerals referring to like features throughout both the drawings and the description.

BRIEF DESCRIPTION OF THE DRAWING(S)

FIG. 1 is an isometric view of an SEL according to one embodiment of the present invention showing light directed normal to and away from the substrate on which the SEL is formed.

FIG. 2 larger scale cross sectional view of portion 30 of the optical cavity of the SEL shown FIG. 1.

DETAILED DESCRIPTION OF THE PREFERRED EMBODIMENTS

Figure 1:
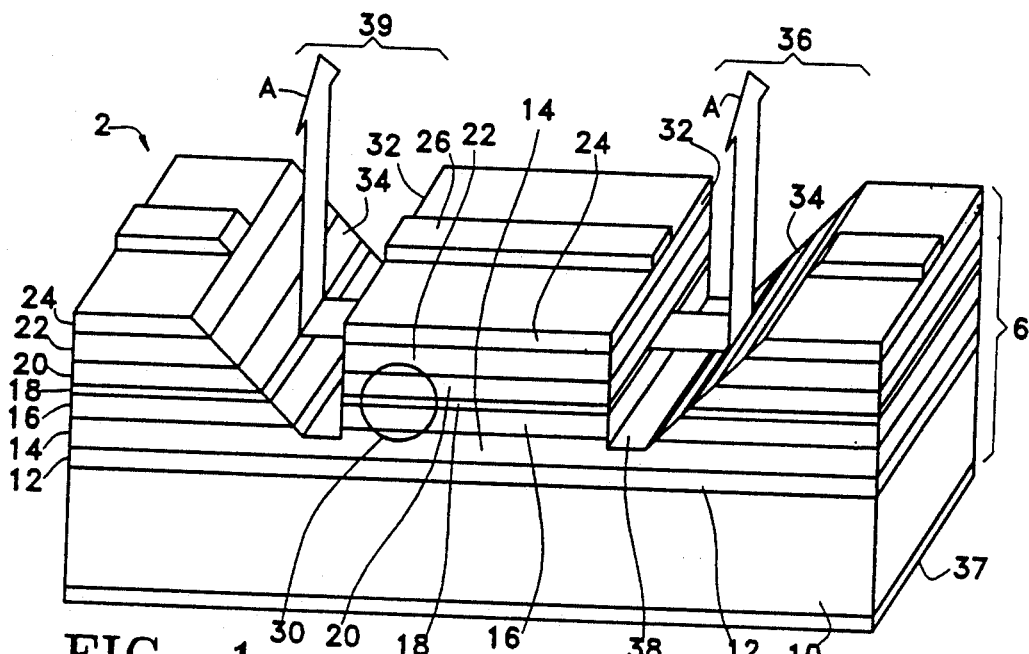
Figure 2:
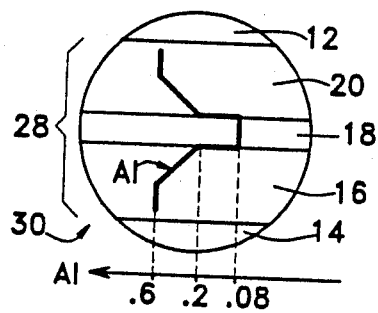
Figure 4:
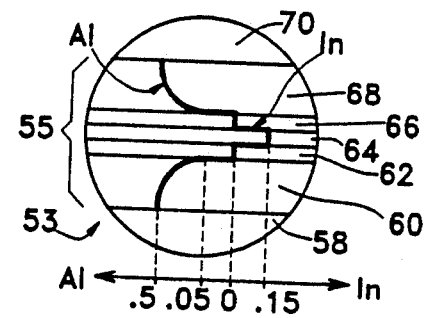
FIG. 4 is larger scale cross sectional view of portion 53 of the optical cavity of the SEL shown in FIG. 3.

In accordance with the present invention, graded refractive index separate confinement heterostructure, or GRINSCH, single quantum well, or SQW, SEL's are formed from a multilayer wafer including a pair of parallel grooves etched into the wafer, each such groove including a vertical oscillator mirror and an integrated 45° beam deflector. In accordance with a first embodiment, SEL 2 is a lattice-matched, or unstrained, AlGaAs/GaAs GRINSCH SQW SEL as shown in FIGS. 1 and 2. In accordance with another embodiment, SEL 4 is a lattice-mismatched, strained or pseudomorphic, InGaAs/AlGaAs GRINSCH SQW SEL which emits radiation at a wavelength to which its substrate is transparent, as shown in FIGS. 3 and 4.

SEL 2 and SEL 4 each have high output power, low threshold current density and relatively high efficiency, and each are processing compatible with conventional large scale integration technology. Such SEL's may be fabricated in large numbers from single wafers.

Figure 3:
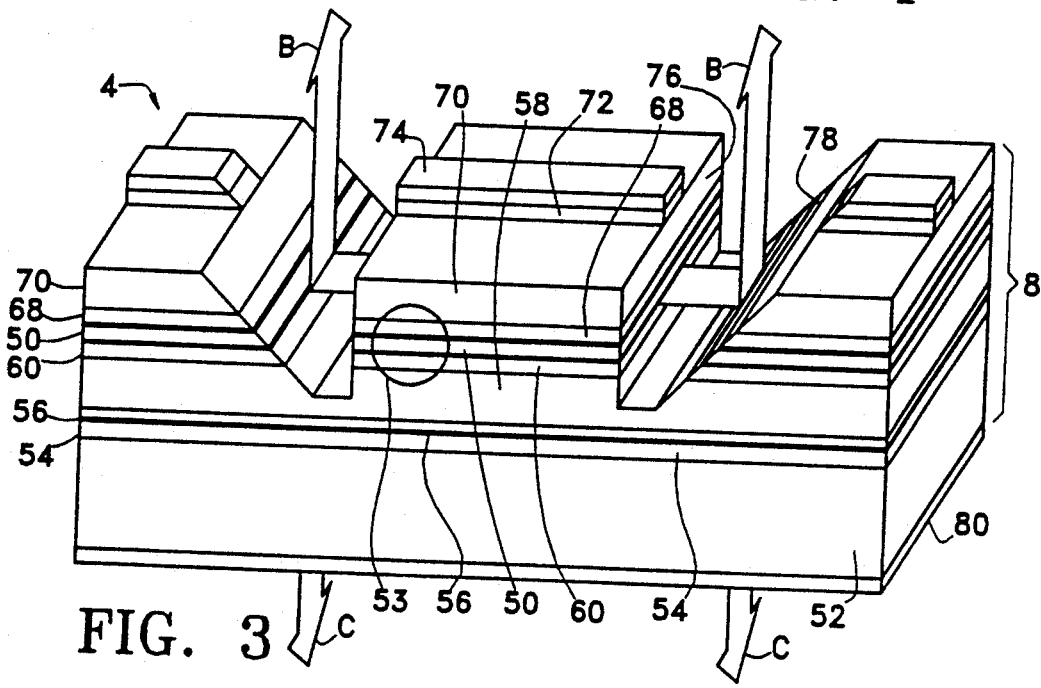
FIG. 3 is an isometric view of another embodiment of the present invention in which the pseudomorphic active layer emits radiation to which the SEL substrate is transparent so that radiation may also be coupled through the substrate.

SEL 2 emits light normal to and away from the wafer, as shown by arrows A in FIG. 1, while SEL 4 emits light both normal to and away from the wafer as shown by arrows B in FIG. 3, as well as normal to and downward into the wafer, as shown by arrows C, also as shown in FIG. 3. Emitting light in two directions permits three dimensional optoelectronic circuit configurations, as will be described below in greater detail.

Referring to FIG. 1, wafer 6 is preferably fabricated by growing GaAs and AlGaAs layers using metalorganic vapor-phase epitaxy (MOVPE). The epitaxial layers are grown with trimethylgallium (TMG), trimethylaluminum (TMA), and arsine (AsH$_3$) using techniques well known in the art. For example, layer growth may be performed at about 750° C. at a rate of about 2.4 μm/hr. The p- and n-type doping sources used for the individual layers, described below, include zinc or beryllium and silicon, respectively, such as diethylzinc (DEZ) for zinc and silane (SiH$_4$) in hydrogen for silicon.

In particular, wafer 6 is fabricated by growing the following epitaxial layers using MOVPE on (100) n$^+$-GaAs substrate 10, the thicknesses stated are approximate and are representative of those presently preferred: 0.5-1.0 μm n$^+$-doped ($3.0$–$5.0 \times 10^{18}$ cm$^{-3}$) GaAs buffer layer 12, 1.0-2.0 μm n-doped ($1.0 \times 10^{17}$ cm$^{-3}$ –$1.0 \times 10^{18}$ cm$^{-3}$) Al$_{0.6}$Ga$_{0.4}$As lower cladding layer 14, undoped 1000-2000 Å Al$_x$Ga$_{1-x}$As lower GRINSCH layer 16, undoped 50-90 Å Al$_{0.08}$Ga$_{0.92}$As SQW active layer 18, undoped 1000-2000 Å Al$_x$Ga$_{1-x}$As upper GRINSCH layer 20, 1.0-2.0 μm p-doped ($1.0 \times 10^{17}$ cm$^{-3}$ –$1 \times 10^{18}$ cm$^{-3}$) Al$_{0.6}$Ga$_{0.4}$As upper cladding layer 22 and 0.1-0.2-μm p$^+$-doped ($3 \times 10^{18}$ –$1.0 \times 10^{1819}$ cm$^{-3}$) GaAs cap layer 24.

Cap layer 24 facilitates the formation of p-type ohmic contact 26, as described below. Lower GRINSCH layer 16, SQW active layer 18 and upper GRINSCH layer 20 form optical cavity 28. Lower GRINSCH layer 16 and upper GRINSCH layer 20 vary in their aluminum composition by being linearly graded away from SQW active layer 18. FIG. 2 is a larger scale cross sectional view of portion 30 of FIG. 1 showing the compositional profile of the GRINSCH SQW optical cavity 28. The AlAs mole fraction of lower GRINSCH layer 16 is linearly graded from about $X = 0.6$ to $X = 0.2$. The AlAs mole fraction of SQW active layer 18 is $X = 0.08$. The AlAs mole fraction of upper GRINSCH layer 20 is linearly graded from $X = 0.2$ to $X = 0.6$.

Each SEL 2 is formed in wafer 6 by etching a pair of grooves, grooves 36 and 39, each such groove including a vertical oscillating mirror, such as mirror 32 and a 45° beam deflector, such as 45° beam deflectors 34. Vertical mirrors 32 and 45° beam deflectors 34 extend down into wafer 6 into lower cladding layer 14. In each such groove, vertical mirror 32 and integrated 45 beam deflector 34, have been simultaneously fabricated using a 30° tilted ion beam etching, or IBE, technique.

From wafer 6, wide stripe (e.g. 50-100 μm) geometry or narrow stripe (e.g. 3-5 μm) ridge waveguide geometry SEL's with etched vertical mirrors and 45° beam deflectors are fabricated. To simultaneously fabricate large numbers of wide stripe broad-are geometry SEL's 2, a photoresist pattern of 100 μm wide stripes, placed 400 μm apart, is applied to the surface of wafer 6, each stripe defining a column of SEL's 2 to be formed.

To fabricate large numbers of narrow stripe ridge waveguide SEL's, 1.0 to 1.5 μm high and 3 to 5 μm wide ridges are formed along the [011] direction using chemical etching to provide lateral current confinement, and then the wafer is covered with dielectric film, for example silicon dioxide or silicon nitride, except the ridges. The stripes are patterned with a 7-μm wide opening, perpendicular to the stripe, for each location in which a groove, such as grooves 36 or 39, including mirror 32 and 45° beam deflector 34, are to be etched. Conventional photoresist is used. For example, a photoresist such as AZ-4620 may be applied 6 μm thick and soft baked at 80° C.

Wafer 6 is placed in an IBE chamber, not shown, and tilted 30° from the horizontal plane, i.e., 60° to the direction of the ion-beam. An IBE beam base pressure of less than $2 \times 10^{-6}$ Torr and operation partial pressure of less than $2 \times 10^{-4}$ Torr is preferred for etching. This may be achieved, for example, with an Ar ion extraction voltage of 500 V, and an ion-beam current density of 0.5 mA/cm$^2$.

Mirrors 32 and 45° beam deflectors 34 are formed as the sides of grooves 36 and 39 etched by the ion-beam. Grooves 36 and 39 preferably have a depth of about 2.5

μm and a bottom 38 of about 1 μm wide. The top opening of grooves 36 and 39 may be from about 5 μm to about 15 μm. A narrower opening improves the external quantum efficiency and the output power of SEL 2.

The etching of grooves 36 and 39 may be completed, using the described parameters, in about 90 minutes. The utilization of an angle-adjustable ion-beam allows simultaneous etching of all portions of grooves 36. The same procedure is then repeated to form companion grooves 39, on the opposite side of each SEL 2. Grooves 36 and 39 of each SEL 2 are preferably spaced about 500 μm apart.

p-type ohmic contact 26 and n-type ohmic contact 37 are then formed on SEL's 2 using conventional electron-beam evaporation techniques. p-type ohmic contact 26 is an approximately 300 μm wide stripe, centered along the length of each column of SEL's 2. p-type ohmic contact 26 may be fabricated, for example, by depositing layers of Ti, Pt and Au of about 500–1000 Å, 500–1000 Å and 3000–5000 Å, respectively, on cap layer 24.

After thinning substrate 10 of wafer 6 to about 75–100 μm, n-type ohmic contact 37 may be fabricated, for example, by depositing layers of Ni, Au-Ge, Ni and Au of about 50–100 Å, 300–500 Å, 100–200 Å and 3000–5000 Å, respectively. p-type ohmic contact 26 and n-type ohmic contact 37 are then alloyed at about 420° C. for approximately 2 minutes.

SEL 2 is preferentially operated under pulsed conditions to avoid thermal effects. For example, pulses of 1 μs width at a 2 kHz pulse repetition rate may be used. The output power from SEL 2 is measured =6 mm above the laser surface with a calibrated large-area silicon p-i-n detector, for example a detector of about 1 cm$^2$.

In operation, laser radiation is generated in optical cavity 28 and is reflected between mirrors 32, which provide optical feedback. After a sufficient light intensity is reached within optical cavity 28, a portion of the light passes through mirrors 32, strikes 45° beam deflectors 34 and is directed upward and away from SEL 2 through grooves 36 and 39 as indicated by arrows A.

Laser output from SEL 2 may be increased if desired by reducing the coupling or absorption of the emitted light into 45° beam deflectors 34. A high-reflectivity, or HR, coating on 45° beam deflectors 34 may be used to reduce such coupling or absorption. A suitable HR coating is, for example, Si/SiO$_2$ multilayers.

Referring now to FIGS. 3 and 4, an alternate embodiment of the present invention is shown. SEL 4 is a 945 nm strained, or pseudomorphic, In$_x$Ga$_{1-x}$As/AlGaAs GRINSCH SQW SEL. SEL 4 incorporates a strained InGaAs SQW active layer 50, where the lattice mismatch is accommodated by an elastic deformation of the lattice.

By replacing the GaAs SQW active layer of the embodiment shown in FIG. 1 with a lattice-mismatched InGaAs SQW, strain induced reduction of valence band non-parabolicity and effective density of states permits operation with a relatively low threshold current and improved spectral and dynamic properties. The reduced current operation of SEL 4 permits increased usage in large scale optoelectronic integrated circuits having limited drive current and heat sinking capabilities.

SEL 4 provides an additional feature which increases its utilization with optoelectronic integrated circuits. SEL 4 emits light downward, as shown by arrows C, as well as upward as indicated by arrows B, due to the transparency of GaAs substrate 52 to light at the lasing wavelength. This permits coupling and/or photosensing circuits to be placed below as well as above SEL 4.

The transparency of the substrate to the emitted radiation provides increased flexibility in circuit design, for example, allowing input and output through the substrate, as well as reduced optical crosstalk and/or undesired coupling between such SEL's and other GaAs electronic circuitry. SEL 4 may, for example, be mounted for optical coupling to the end of a fiber optic rod, not shown.

Wafer s is fabricated by growing the following epitaxial layers using conventional techniques, preferably molecular beam epitaxy, or MBE, on (100) n$^+$-GaAs substrate 52. The following layer thicknesses are approximate and are representative of those presently preferred: 0.5–1.0 μm n$^+$-doped (3.0–5.0×10$^{18}$ cm$^{-3}$) GaAs buffer layer 54, 5 period 100 Å GaAs/100 Å Al$_{0.5}$Ga$_{0.5}$As superlattice buffer layer 56, 1.0–2.0 μm n-doped (1.0×10$^{17}$ –1.0×10$^{18}$ cm$^{-3}$) Al$_{0.5}$Ga$_{0.5}$As lower cladding layer 58, undoped 100014 2000 Å Al$_x$Ga$_{1-x}$As lower GRINSCH layer 60, undoped 25–100 Å lower GaAs growth stop layer 62 on one side of active layer 64, undoped 50–90 Å In$_{0.15}$Ga$_{0.85}$As SQW active layer 64, undoped 25–100 Å upper GaAs growth stop layer 66 on the other side of active layer 64, undoped 1000–2000 Å Al$_x$Ga$_{1-x}$As GRINSCH upper layer 68, 1.0–2.0 μm p-doped (1.0×10$^{17}$ –1.0×10$^{18}$ cm$^{-3}$) Al$_{0.6}$Ga$_{0.4}$As upper cladding layer 70 and 0.1–0.2–μm p$^+$-doped (0.5×10$^{18}$ –1×10$^{19}$ cm$^{-3}$) GaAs cap layer 72.

The thickness of strained SQW active layer 64 should be well below the limit for strain-induced relaxation through the formation of misfit dislocations. The substrate temperature may be varied during growth to optimize growth conditions for each material, for example, about 530° C. for In$_{0.15}$Ga$_{0.85}$As SQW active layer 64, about 710° C. for Al$_x$Ga$_{1-x}$As GRINSCH layer 60 and 68 and Al$_{0.6}$Ga$_{0.4}$As cladding layers 58 and 70, and about 600° C. for buffer layer 54 and cap layer 72.

Cap layer 72 facilitates the formation of and may be limited to the width of p-type ohmic contact 74, described below.

Lower GRINSCH layer 60, SQW active layer 64 and upper GRINSCH layer 68 form optical cavity 55 of SEL 4. Lower GRINSCH layer 60 and upper GRINSCH layer 68 vary in their indium composition profile by being parabolically or linearly graded away from SQW active layer 64.

FIG. 4 is a larger scale cross sectional view of portion 53 of SEL 4 shown in FIG. 3 showing the compositional profile of GRINSCH SQW optical cavity 55. The InAs mole fraction of lower GRINSCH layer 60 is parabolically or linearly graded from $X=0.5$ to $X=0.05$, the InAs mole fraction of SQW active layer 64 is $X=0.15$ and the InAs mole fraction of upper GRINSCH layer 68 is parabolically or linearly graded from $X=0.05$ to $X=0.5$.

Superlattice buffer layer 56 is comprised of five alternating layers of GaAs/Al$_{0.5}$GA$_{0.5}$As with GaAs being the outermost layers. Each of the layers is about 100 Å thick.

Each SEL 4 is formed in wafer 8 by forming two vertical mirrors 76 and two 45° beam deflectors 78 into wafer 8, extending down to lower cladding layer 58 in the same manner as described above with regard to SEL 2 as shown in FIG. 1.

p-type ohmic contact 74 and n-type ohmic contact so are then formed on each SEL 4 using conventional techniques, such as the technique described above for SEL 2.

SEL 4 is preferentially operated under pulsed conditions to avoid thermal effects. For example, pulses of 1 μs width at a 2 kHz pulse repetition rate may be used. The output power from SEL 4 is measured =6 mm above the laser surface with a calibrated large-area silicon p-i-n detector, for example a detector of about 1 cm². In operation, laser radiation is generated in optical cavity 55 and is reflected between mirrors 76, which provide optical feedback. After a sufficient light intensity is reached within optical cavity 55, a portion of the light passes through mirrors 76 and strikes 45° beam deflectors 78. A portion of the light is directed upward and away from SEL 4 as indicated by arrows B, and a portion of the light is directed downward through wafer 8 as indicated by arrows C.

As with SEL 2, laser output from SEL 4 may be increased if desired by reducing the coupling or transmission of the emitted light into 45° beam deflectors 78. An HR coating, such as Si/SiO₂ multilayers, on 45° beam deflectors 78 may be used to reduce such coupling.

While this invention has been described with reference to its presently preferred embodiments, its scope is not limited thereto. Rather, such scope is only limited insofar as defined by the following set of claims and includes all equivalents thereof.

What is claimed is:

1. A surface emitting semiconductor laser comprising:
   a GRINSCH SQW laser structure including an active SQW layer between a pair of GRINSCH layers on a substrate, said active layer having a horizontal laser cavity therein; and
   a pair of parallel grooves etched in said substrate through said SQW and GRINSCH layers, each such groove including a substantially vertical oscillating mirror and a substantially 45° beam deflector for said laser cavity.

2. The surface emitting semiconductor laser claimed in claim 1 wherein said GRINSCH SQW laser structure is pseudomorphic.

3. The surface emitting semiconductor laser claimed in claim 2 wherein the active layer is thin enough to permit accommodation of pseudomorphic lattice mismatch by elastic deformation.

4. The surface emitting semiconductor laser claimed in claim 2 wherein the thickness of the active layer is below the limit for strain-induced relaxation of pseudomorphic lattice mismatch through formation of misfit dislocations.

5. The surface emitting semiconductor laser claimed in claim 1 wherein said GRINSCH SQW laser structure comprises:
   $Al_xGa_{1-x}As$ GRINSCH layers; and
   5 an GaAs or $Al_xGa_{1-x}As$ active layer.

6. The surface emitting semiconductor laser claimed in claim 1 wherein said GRINSCH SQW laser comprises:
   $Al_xGa_{1-x}As$ GRINSCH layers; and
   a pseudomorphic $In_xGa_{1-x}As$ active layer.

7. The surface emitting semiconductor laser claimed in claim 1 wherein the substrate is transparent to the wavelength of light resonant in said laser cavity.

8. The surface emitting semiconductor laser claimed in claim 1, further comprising:
   an upper cladding layer doped with zinc or beryllium.

9. The surface emitting semiconductor laser claimed in claim 8, further comprising:
   a cap layer doped with zinc or beryllium.

10. The surface emitting semiconductor laser claimed in claim 1, further comprising:
    a cap layer doped with zinc or beryllium.

11. The surface emitting semiconductor laser claimed in claim 1, further comprising:
    a buffer layer doped with silicon.

12. The surface emitting semiconductor laser claimed in claim 1, further comprising:
    a lower cladding layer doped with silicon.

13. The surface emitting semiconductor laser claimed in claim 1, further comprising:
    a lower cladding layer doped with silicon.

14. The method of fabricating surface emitting semiconductor lasers, comprising the steps of:
    forming a GRINSCH SQW laser structure having an active layer with a horizontal laser cavity in a substrate; and
    etching a pair of parallel grooves in the substrate, each such groove including a substantially vertical oscillating mirror and a substantially 45° beam deflector for said laser cavity.

15. The method claimed in claim 14 wherein the step of etching the grooves further comprises:
    applying a tilted angle ion beam to said substrate to etch each groove.

* * * * *